United States Patent [19]

Jeannot et al.

[11] Patent Number: 4,561,960

[45] Date of Patent: Dec. 31, 1985

[54] ARRANGEMENT FOR ELECTROLYTIC DEPOSITION OF CONDUCTIVE MATERIAL ON INTEGRATED CIRCUIT SUBSTRATES

[75] Inventors: Michel Jeannot, Neuchâtel; Italo Salvalai, Peseux, both of Switzerland

[73] Assignee: Ebauches Electroniques SA, Marin, Switzerland

[21] Appl. No.: 668,242

[22] Filed: Nov. 5, 1984

[30] Foreign Application Priority Data

Dec. 1, 1983 [CH] Switzerland .......................... 6430/83

[51] Int. Cl.⁴ ............................................. C25D 17/06
[52] U.S. Cl. ................................................. 204/297 W
[58] Field of Search ................... 204/194, 198, 224 R, 204/297 W

[56] References Cited

U.S. PATENT DOCUMENTS

| | | | |
|---|---|---|---|
| 1,749,953 | 3/1930 | Tichtman | 204/297 W |
| 2,199,487 | 5/1940 | Etchison | 204/297 W |
| 3,347,771 | 10/1967 | Reznick | 204/297 W |
| 3,429,786 | 2/1969 | Kubik | 204/297 W |

OTHER PUBLICATIONS

Western Electric Technical Digest No. 19, Jul. 1970, pp. 17, 18.
High Capacity Liquid Phase Epitaxy Apparatus Utilizing Thin Melts, (Solid-State Electronics, 1973, vol. 16, pp. 1289–1295, Pergamon Press, Printed in G.B.) O. G. Lorimor, R. H. Saul, L. R. Dawson & C. R. Paola.

Primary Examiner—T. M. Tufariello
Attorney, Agent, or Firm—Pollock, Vande Sande & Priddy

[57] ABSTRACT

The arrangement which is designed to be put into an electrolytic vat comprises a framework arranged to receive several pairs of substrates placed back-to-back, mechanical systems fixed to the framework for positioning and maintaining the substrates in place on the framework and an electrical system likewise fixed to the framework and having contact points to enable coupling the conductive layers of the integrated circuits onto which the conductive material is to be deposited to the feed voltage source of the vat.

Preferably the mechanical systems are designed to maintain the two substrates of each pair in contact one against the other.

20 Claims, 17 Drawing Figures

ARRANGEMENT FOR ELECTROLYTIC DEPOSITION OF CONDUCTIVE MATERIAL ON INTEGRATED CIRCUIT SUBSTRATES

This invention concerns manufacture of integrated circuits and has as object an arrangement intended to be employed when one proceeds with the galvanic deposition of a conductive material on the substrates of the circuits, and in particular when it is required to form the connection points for each integrated circuit on a substrate to which thereafter are soldered, for example by thermo-compression, the thin wires serving to connect electrically the circuit with the exterior.

BACKGROUND OF THE INVENTION

Figure 1:
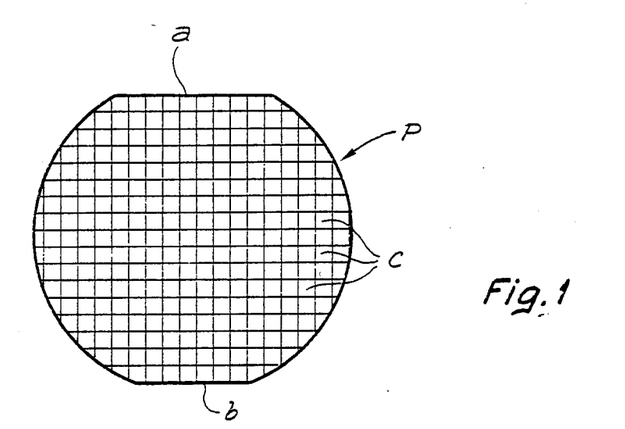
FIG. 1 is the schematic view of a front surface of a substrate of an integrated circuit.

The realization of integrated circuits is often obtained in the following manner:

One begins with a highly purified block of monocrystalline silicon which is cut into thin slices in order to obtain substrates in the form of discs such as that, P, shown on FIG. 1 and of which the dimensions are intended so that each of them may group together at least several hundreds of elementary circuits which are symbolized on the figure by the small squares C. The circumference of these discs which are often referred to as "wafers", is generally not entirely round and shows two diametrally opposed linear portions of unequal length which are designated by the indications a and b on FIG. 1 which, however, in reality are much less pronounced than on the drawing.

In most cases the substrates are initially submitted to a treatment which enables forming on the surface thereof, i.e. that on which the circuits are to be integrated, a protective layer of silicon dioxide ($SiO_2$).

The number, type and the order of succession of the operations which follow thereafter depend naturally on the integration technology employed and the nature of the elements which compose each circuit to be integrated. Principally, it involves operations of doping and local depositions of layers which may be conductive, semiconductive or insulating. Most of these operations are preceded by a phase in which the zones to be treated are limited by using a well-known technique of photo-engraving.

Once these various stages have been undertaken one proceeds to the realization of the metallizations which serve to couple different elements of each circuit among one another and/or to placing of the connection studs but which also often serves to terminate the manufacture of certain components, for instance to form the gate of a transistor or of the second plate of a capacitor. In certain cases one may foresee several networks of interconnections superposed on one another which are separated by insulating layers.

The so-called circuits being then terminated such are covered over by an insulating protective layer, for instance a layer of glass.

Next one proceeds to the formation of connection studs as previously mentioned, more commonly known as "bumps", thereafter the circuits are separated from one another by breaking up the silicon substrate into "chips" often after having previously thinned it down.

There then remains nothing more but to fix the chips onto supports, to couple together the connection studs by means of thin wires, e.g. of gold, to the exterior connectors and finally to encapsulate each circuit in a sealed casing or to enrobe it with plastic always allowing the exterior connectors to exit.

Naturally, most of the operations that take place after the enrobing of the circuits by a protective layer are followed by inspection or by testing (optical inspections, electric testing before and after the placing into the casing, tests of the sealing of the casing, etc.).

FIGS. 2a to 2h illustrate by way of example a process which is presently employed to form the connection studs in gold on circuits previously integrated on a silicon substrate, when the metallizations have been obtained in aluminum. The relationships between the thicknesses of the different layers as represented on the figures evidently do not correspond to reality.

The cross-section of FIG. 2a shows the substrate of integrated circuits in a zone where there must be obtained a connection stud. Thereat the substrate 1 is covered over by at least one layer 2 of silicium ($SiO_2$), a metallization in aluminum 3 and a protective layer 4, for instance of glass.

As is shown by FIG. 2b the first stage of the process consists of opening a window 10 in the protective layer 4, generally of square or rectangular form, at each place where a connection stud is to be formed. This is realized by utilizing the technique of photo-engraving.

Next one deposits by evaporation under vacuum a layer of titanium-tungsten 5, then a layer of gold 6, this over the entire surface of the substrate (see FIG. 2c). These intermediate metallic layers are provided to avoid that the gold to be thereafter galvanically deposited diffuses to the interior of the aluminum forming the metallization. This phase may be unnecessary if the metallizations themselves are of gold.

When the deposition of the intermediate layers 5 and 6 has been effected, the front and back surfaces of the substrate are covered over by a layer of photo-sensitive resin respectively 7 and 8 (see FIG. 2d). Since the layer 8 on the back surface has as its only purpose that of avoiding gold deposition on this surface when the substrate is ulteriorly placed in the galvanic bath, this layer may very well consist of another insulating material, e.g. of a lacquer, which is not attacked by the products forming the bath.

Next the front face of the substrate is exposed to light across a mask and one proceeds to the development operation which enables opening the windows in the layer of resin 7 and thus baring the layer of gold 6. As shown by FIG. 2e these windows are centered on and are visibly larger than windows 10 which have been opened in the protective layer 4.

After having effected by suitable means a careful cleaning of the substrate to remove every trace of the resin on the gold layer 6, at places where the latter has been bared, one proceeds with the realization of the connection studs.

For this one usually begins by placing several substrates side by side on one or several supports which are thereafter plunged into an electrolytic bath containing a solution of one or several gold salts often together with one or several additives and in which is placed at least one anode.

The electrical coupling, which enables placing the gold film 6 and the underlying conductive layers 3, 5 of each substrate at a negative potential thus to cause these layers to play the role of cathode during the time that the substrates are immersed in the bath, is obtained by means of one or several, for instance three, contact points which penetrate the layer of photo-sensitive resin 7 at places where the latter still remains and which are coupled to the negative terminal of the feed voltage source serving to energize the bath. The FIG. 2f shows one of these contact points designated by the indication 12. Naturally to avoid risk of damaging the circuits, the points are arranged at the periphery of the substrate and are not necessarily in proximity to places where the connection studs are to be formed.

In certain cases the contact points are fixed to the substrate supports and are manually placed before the substrates are immersed in the bath, but it may also happen that these points are not coupled to the support. In certain machines for instance they may be fixed to a cover and are only brought into position when the cover is lowered.

When the substrates have remained a sufficient length of time in the bath for the connection studs to have attained the desired thickness, they are removed from the vat and dried.

It then remains to remove the resin 7 still on the front face of the substrates and the protective layer 8 on the back surface (see FIG. 2g), to remove likewise the layers of gold 6 and titanium-tungsten 5 elsewhere than at the locations of the connection studs 11 (see FIG. 2h), to inspect the substrates, to submit these to a thermal treatment to assure a good crystalline coupling between the different metallic layers 3, 5, 6 and 11 and finally to effect an electrical test.

This process of providing connection studs has been chosen as example for a reason which will appear hereinafter but it is evident that there exist others more or less different according to the technology employed to obtain the integrated circuits. For example, the process would no longer be the same as that which has just been described, all else being equal, if the metallizations 3 were not of aluminum but rather gold and/or if the connection studs were realized in another metal, for example copper.

Machines presently available for galvanic treatment of integrated circuit substrates exist in different forms, more or less complicated, but all have a major difficulty, that of enabling the treatment of only a very small number of substrates at a time. For instance there exists at present on the market expensive and sophisticated apparatus which accepts only twenty-four substrates at a time.

From this fact the formation of connection studs is often the cause of a slowing down in the production of integrated circuits, except in the case of substantial investments to provide a sufficiently large number of machines moreover taking up a great deal of space.

This invention has as its purpose, if not to avoid entirely, at least to minimize this difficulty by multiplying the number of substrates which may be treated at the same time in one and the same machine.

On the other hand, the low rate of production at the stage of formation of the connection studs is also due to the fact that these necessitate, as one has seen, a large number of operations.

Another purpose of the invention is to enable to the extent possible, the elimination of one or several of these operations.

SUMMARY OF THE INVENTION

These purposes are attained thanks to the arrangement as claimed which comprises a special support for the substrates intended to be placed in an electrolytic vat which may be of an existing form and which includes the necessary means, notably the contact points to couple the conductive layer of the substrates on which is to be effected the deposition of another conductive layer to the feed source of the vat. In sum it comprises an arrangement for the electrolytic deposition of a conductive material on integrated circuit substrates each having a front face bearing an electrically conductive layer on which said material is to be deposited at least locally and a back, said arrangement being designed to be put into an electrolytic vat fed by a direct current source located outside said vat, said arrangement comprising a framework arranged to receive at least a first pair of integrated circuit substrates, a mechanical system fixed to the framework for positioning and maintaining said substrates in place, a mechanical system fixed to the framework for positioning and maintaining said substrates back-to-back on the framework, and an electrical system likewise fixed to the framework to enable coupling said electrically conductive layer of each substrate to said source.

DESCRIPTION OF THE PREFERRED EMBODIMENT

Figure 3:
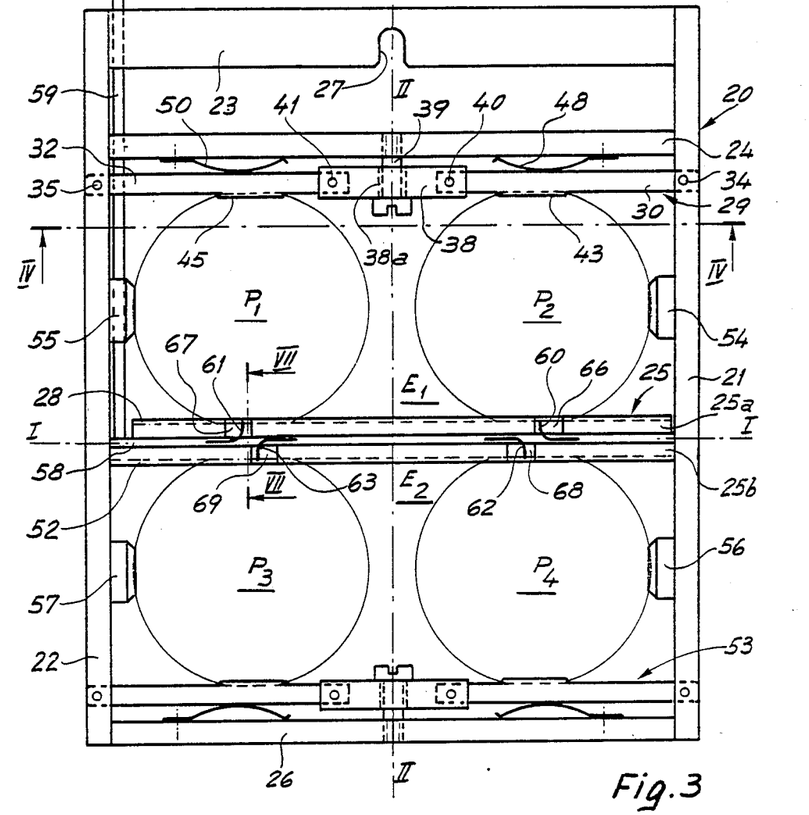
FIG. 3 is a front face view of the arrangement chosen as example according to the invention.

In the form of realization which is now about to be described in detail and which is shown in front view in FIG. 3, the arrangement according to the invention is intended to enable the galvanic deposition on eight substrates at the same time and may be vertically positioned in the electrolytic vat which is employed to effect the deposition.

This arrangement comprises a rigid framework of rectangular form 20 formed from two vertical risers 21, 22 and four horizontal runners 23, 24, 25, 26 which, as in the case of other elements which will be described hereinafter, are assembled, preferably by means of screws not shown, in order to facilitate the assembly and disassembly of the arrangement and eventually the replacing of defective parts. Naturally other assembly means may be chosen, e.g. by means of glue.

All parts of the framework 20 including the screws are formed of an electrically insulating material, e.g. in a hard plastic material which is not susceptible to corrosion by the galvanic bath in which the arrangement must be placed almost in its totality. It will be well understood that the material employed is not necessarily the same for all elements. For example the material employed for the screws is generally different from that from which the risers and runners are formed.

For the rest, in contrast to the runners 23, 24 and 26 which, in the same manner as risers 21, 22 are formed by simple bars of square or rectangular cross-section, runner 25, situated essentially midway between runners 24 and 26, is in two parts. It comprises a first bar 25a the length of which is less than the distance between the two risers and which rests indirectly on a second bar 25b which is fastened to the risers of the framework. Between the two bars 25a and 25b will be found a further bar 58 of thinner cross-section which in contrast to the elements of the framework 20 is metallic and covered over by a layer of electrically insulating material, e.g. a layer of plastic material or paint. This bar 58 forms part of the electrical system which when the substrates are placed on the arrangement enables coupling the electrical layers of the integrated circuits on which the deposit must be effected to the feed voltage source of the vat and which will be described in detail hereinafter. The two portions of the runner 25 and the metallic bar 58 are also assembled preferably by means of plastic screws not shown on the figure.

This arrangement permits assuring the fastening of the electrical system which is in a single piece to the framework and has as particular advantage to facilitate the manufacture and the placing in position of the electrical system, to permit changing this latter without any difficulty when such appears necessary and to endow the assembly with good rigidity. At the same time it is evident that there exist further possibilities no less advantageous. One might envisage for example realization of the runner 25 in the form of a single bar with conductive bands or wires along the sides thereof.

The runner 23 located at the upper extremity of the risers and of which the lower edge is provided with a central notch 27 does not have any role to play with respect to the substrates. It is only provided in order to enable suspension of the arrangement in the vat in the case for instance where the latter is surmounted by a horizontal bar and it might readily be replaced as convenient, either by one or several hooks fixed to the ends of the risers or on a runner 24, or by projecting lateral arms which would be supported on the edges of the vat or on supports foreseen for this purpose or by still other suspension means.

To simplify the following description and in view of the fact that the runner 23 which has just been mentioned is not an indispensable element of the arrangement, the other three runners 24, 25, 26 will be designated respectively as "upper", "central" and "lower".

On the other hand, in order better to illustrate on the one hand the dimensions which the different portions of the arrangement have relative to those of the substrates and on the other hand the manner of operating the positioning means and the maintaining of these latter on the framework, which will be described further on, the arrangement has been represented on FIG. 3 essentially to the same scale as the arrangement with the substrates in place. Naturally, as the latter are arranged in pairs, the two substrates of a same pair being placed back to back and as the arrangement is intended to receive four pairs of substrates in the plane of the framework 20, only four of the substrates designated by the indications $P_1$, $P_2$, $P_3$, $P_4$ are visible on the figure.

It is seen that on one hand the upper runner 24 and the first portion 25a of the central runner 25 and, on the other hand, the second portion 25b of the central runner and the lower runner 26 define with the two risers 21, 22 two rectangular spaces $E_1$, $E_2$ of the same width and naturally of the same height, each intended to receive two pairs of substrates one beside the other. The height of these spaces is slightly greater than the diameter of the substrates to leave a place for one portion of the positioning means and to maintain in place the latter, while their width is slightly greater than double this diameter in order to facilitate placing the substrates on the arrangement. For example, for a substrate diameter of about 10 cm, a height of 11.5 cm or 12 cm and a width of 24 or 25 cm would be very suitable.

The system of positioning and maintaining in place provided for the substrates placed in the upper space $E_1$ is completely identical to that which is provided for the substrates arranged in the space $E_2$. The two systems are essentially symmetric relative to the median plane I—I of the central runner 25. Herein will thus be described a single arrangement, that of the upper. For this reference will be made to FIGS. 3 to 7.

The system consists mainly of a longitudinal groove in V form, 28, which is provided in the upper surface of the first bar 25a of the central runner and of a mechanism 29 situated in the upper portion of space $E_1$ and which has particularly as role to exert on each substrate a vertical force tending to urge the substrate downwardly. The V groove 28 of bar 25 is intended to receive the edges of the substrates at one of the two linear portions a, b (see FIG. 1), preferably the portion a which is the longer. As shown by the enlarged cross-section of FIG. 7, the substrates have a rounded periphery which causes, if the interior angle of the V of the groove has a suitable value, if the edges of the two substrates $P_1$, $P'_1$ are placed exactly back to back in the groove in a manner such that the peripheries are each in contact with a side of this groove and that the substrates are essentially vertical, and finally if a constant force likewise vertical is applied thereto, the sides of the groove to provide on the edges of the substrates two opposite forces which will tend initially to bring them in contact with one another if they are not already so and to maintain them in contact perfectly coupled to one another.

There will now be described the mechanism 29 which enables applying this vertical force from top to bottom on the substrates when they are in place and which also comprises a V groove for each pair of substrates, which acts in the same manner on the peripheries of the substrates as that of bar 25a but in their diametrally opposed portion.

Figure 4:
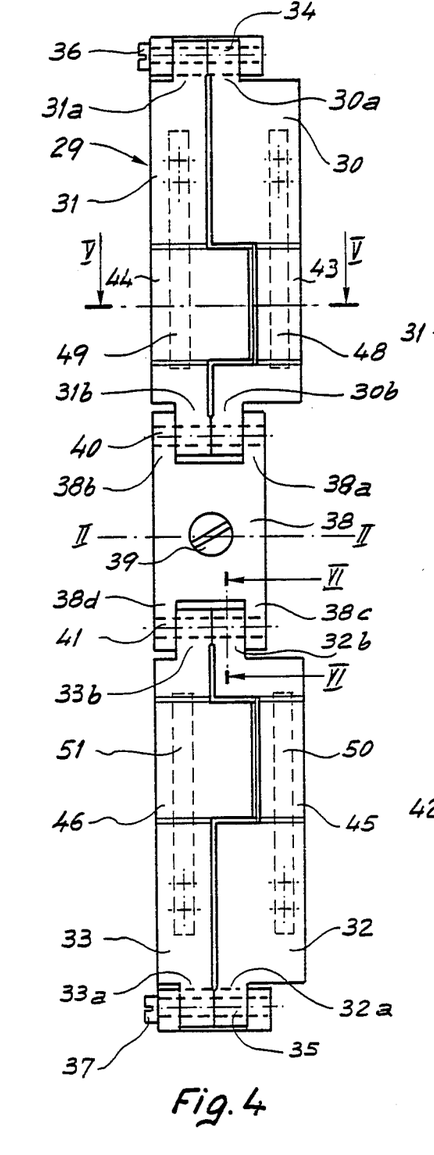
FIG. 4 is a cross-sectional enlarged view according to the section IV—IV of FIG. 3.

Regarding further FIG. 3 and likewise the enlarged cross-sectional view of FIG. 4, it will be seen that mechanism 29 is symmetric relative to the vertical median plane II—II of the framework and that it comprises on each side of this plane a pair of small levers 30, 31, respectively 32, 33 of the same length and of square or rectangular cross-section which are stacked in a direction perpendicular to the plane of the framework, i.e. to that of FIG. 3 and which are at a small distance from one another, e.g. 1 mm, except at each end where they are coupled together. These levers are fastened by one of their ends 30a, 31a, respectively 32a, 33a to the corresponding riser of framework 20 in a manner so as to be able to pivot together and separately at least by a small angle about a common axis 34, respectively 35, coupled to the riser and perpendicular to the plane of the framework. This arrangement may be obtained for example by means of a screw 36, respectively 37, traversing the riser and the ends of the levers and of which the axis comprises the pivoting axis of these latter.

As shown on FIG. 4, each lever does not necessarily have a constant cross-section and the latter is not necessarily the same for the two levers of the same pair. The form of these levers is in fact determined by the manner in which the arrangement is conceived in the detail thereof.

Figure 5:
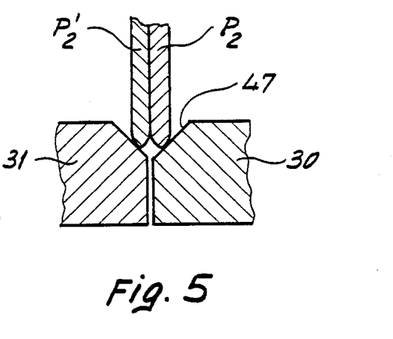
FIGS. 5 and 6 are enlarged cross-sectional views respectively according to sections V—V and VI—VI of FIG. 4.

The two levers of each pair exhibit on their surface facing the central runner 25 and spaced at an equal distance from the framework riser a flat elongated protuberance 43 respectively 44 and 45, respectively 46, the length of which is approximately equal to that of one or the other of the rectilinear portions a, b (see FIG. 1) of the edges of the substrates and of which the center is situated at a distance from the framework riser greater than the radius of these substrates. Moreover, as shown by FIG. 5, the protuberance of each lever seen from the side of the other lever, has its edge chamfered in a manner to form the V groove mentioned hereinabove, this groove, 47 being found facing that of the bar 25a of the central runner 25 and having approximately the same opening dimension.

It is to be noted that the protuberances 43 and 44 are above all intended to facilitate the putting into place, the removal and eventually the correct positioning of the substrates on the framework and that they are not indispensable. A V groove formed along the entire length or part thereof of a slot separating two levers without protuberances would equally be suitable.

The two pairs of levers are joined by a central portion 38 in form of an H between the legs 38a, 38b, 38c, 38d in which are engaged and maintained in a manner to be subsequently described the ends 30b, 31b, 32b and 33b of the levers. This member 38 includes in its center a hole 38a through which passes a partially threaded screw 39 and of which the end is screwed into the upper runner 24 of the framework, in a manner to enable a slight vertical displacement of the central piece 38 between a lower position where it is supported on the head of screw 39 and an upper position for which it comes into contact with the upper runner.

The union between each pair of the levers 30, 31, respectively 32, 33 and the central member 38 is obtained by means of an axis 40, respectively 41, which passes through holes formed in the legs 38a, 38b, respectively 38c, 38d, of the H and in the ends 30b, 31b, respectively 32b, 33b of the levers.

Figure 6:
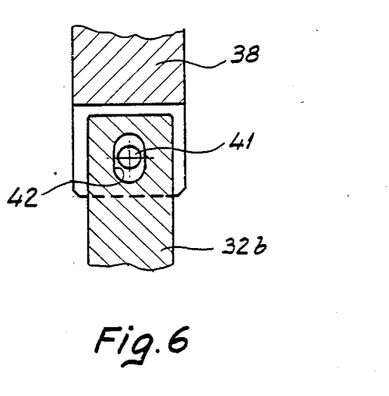

As shown in the enlarged cross-sectional view of FIG. 6, in order that one may vertically displace the connecting piece 38 and to cause the levers to pivot about the axes 34 and 35 which are joined to the framework risers, the holes 42 formed in the ends of these levers and through which pass axes 40 and 41 are holes of oblong form of which the length is in the direction of the levers and slightly greater than the diameter of the axes 40, 41. FIG. 6 likewise shows that holes 42 are designed in order that there be a certain play between their edges and the axes 40, 41 in the sense of the width. This play which is less than that which exists in the longitudinal sense of the holes is provided in order that the two levers of one pair may have relative to one another a shearing motion of very slight amplitude but sufficient to compensate for the differences in diameter which may be present on the substrates of the integrated circuits and which may easily attain 5/10 mm or even more.

To be noted is the fact that because of this difference of diameter which one substrate may exhibit relative to another in the present realization of the arrangement according to the invention, four levers are forseen. Evidently, one may easily conceive an arrangement less perfected which would comprise only one lever for each pair of substrates or yet another solution, for example a single lever per pair of substrates with the edges of the V shaped groove of this lever and/or the central runner 25 covered with a fine layer of insulating elastic material.

To return to the form chosen as example, there remains to be said, on the one hand, that the mechanism 29 likewise includes four spring blades 48, 49, 50, 51 in elastic insulating material or in metal covered with an insulating layer which are fastened at least by one of their ends onto the lower surface of the upper runner 24, for example by means of screws not shown, and which act each respectively on one of the levers 30–33 in a manner to exert thereon the necessary vertical force to maintain the pairs of substrates in place and the two substrates of each pair coupled back to back and on the other hand, the dimensions of the different portions which comprise mechanism 29 and the position of the pivoting axes 34, 35 on the risers 21, 22 of framework 20 are such that, in the presence of the integrated circuit substrates, levers 30–33 are practically parallel to the framework runners, the coupling piece 38 being found then butted against the head of screw 39.

As has already been said, the positioning and maintenance system of the substrates in the lower space $E_2$ of the framework is completely identical to that which has just been described. Just as in the case of the upper bar 25a of the central runner 25 the lower bar 25b comprises a longitudinal groove 52 and one finds in the lower portion of space $E_2$ the same system of levers, the springs and the central screw of this system 53 being this time fastened to the lower runner 26 of the framework. Each substrate positioning and maintaining system may moreover comprise two abutments 54, 55 respectively 56, 57, fastened each onto a riser 21, 22 of the framework, midway between the central runner 25 and the lever mechanism 29 respectively 53 and which also may provide grooves in V form on the surfaces opposite to those which contact the risers. These abutments 54–57 have as purpose to facilitate positioning of the pairs of substrates in a manner such that the rectilinear portions a or b of the edges of the latter are well seated in the V grooves 47 formed at the protuberances 43–46 on the levers and in the face of which are the contact points which form a portion of the electrical system which will hereinafter be described.

This electrical system which, as has already been indicated, is in a single piece supported by the framework, comprises, in addition to the bar 58 which is held between the two portions 25a, 25b of the central runner, a straight metallic stem 59 of which one end is welded to an end of the bar 58 and which follows one, 22, of the risers of the framework and is elongated beyond the suspension runner 23. This stem bears on its free end a head not shown on FIG. 3 which is designed for instance to accommodate a plug or to be retained by a crocodile-type clamp, this plug or clamp being electrically coupled to the negative terminal of the vat feeding source.

The electrical system likewise comprises eight rigid conducting wires, i.e. one for each substrate.

Four of these wires 60, 61, 62, 63, are soldered onto one of the sides of the metallic bar 58 and the other four 60′–63′, which are not visible on FIG. 3, onto the other side.

Figure 7:
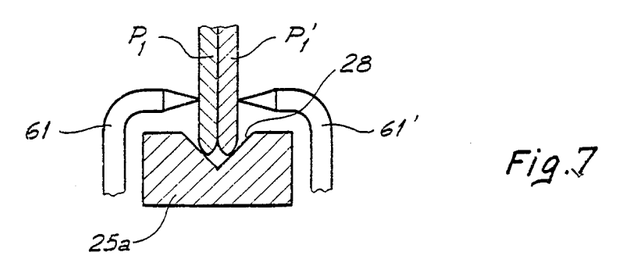
FIG. 7 is an enlarged cross-section according to the section VII—VII of FIG. 3 showing a possible form of realization of the contact points.

As is shown by FIG. 7, each of these wires terminates in a point and is bent in a manner such that the point is perpendicular to the front surface of the corresponding substrate and may be brought to bear elastically against this surface.

Finally, it is noted that with the exception of the head at the end of the stem 59 and the ends of the contact points, the entire electric system is covered by a protective layer of electrically insulating material, e.g. plastic paint.

There exist different means of placing the substrates on the arrangement which are evident. The simplest consists for instance for substrates $P_1$ and $P'_1$, initially to place these latter back to back in assuring that the rectilinear portions a, b (see FIG. 1) of their edges coincide approximately, to introduce vertically the longer of the rectilinear portions into the V groove of bar 25a, by spreading slightly the contact points 61, 61′, to raise the connecting piece 38, to bring the upper edges of the substrates to face the V groove formed by levers 32 and 33 and to allow the connecting piece to redescend. There remains nothing more than to slide the pair of substrates slightly in order to bring them against the lateral abutment 55 and to press the contact points 61, 61′ in order to have them traverse the photo-sensitive resin layer which covers the substrates and to thus bring them into contact with the conductive layer on which the connection studs must be formed.

It should be noted that the arrangement which has just been described may be considered as a module which may be associated with one or several others to form an assembly permitting the simultaneous treatment of a much greater number of substrates. It is clear that in this case certain members such as the risers or the runners of the framework might be common to two or several modules.

It is likewise important to emphasize that the arrangement according to the invention enables the simultaneous placement in an electrolytic vat of twice as many substrates as in the case if the latter were simply arranged side by side as in comparable existing systems. If further permits when concerned with forming connection studs for integrated circuits on a substrate of semi-conductive material employing the process precedingly described relative to figures 2a and 2h, to avoid the necessity of covering the rear surface of the substrates with a layer of photo-sensitive resin or other insulating material to prevent a deposit of metal on this surface, and thereafter to remove such protective layer.

The elimination of these two operations which is possible thanks to the fact that the substrates are placed back to back on the arrangement and maintained in contact against one another represents not only a time saving, but also a saving in material.

If there be added to that the fact that the placing of the substrates is facilitated and much more rapid than in the case of the known arrangements and notably those where the contact points are not fixed to the substrate support and where the substrates must be positioned with great precision it will be seen that the arrangement according to the invention enables easily to attain the principal goals sought, i.e. to increase the rate of production and to realize an economy at the stage of obtaining the connection studs, in the production line of the integrated circuits.

In fact the relatively low productivity at the stage of realization of the connection studs and the importance thereof in the cost of manufacture of these circuits is not only due to the fact that presently the latter necessitates numerous operations and manipulations which are rather long and that very few substrates may be simultaneously treated in a single apparatus, but also to the fact that a rather high percentage of rejects results and this in particular for the following reasons:

Initially, it is always possible that during the growth of the connection studs, bubbles of hydrogen will attach themselves on the latter. It is thus necessary from time to time to shake the substrate supports or to stir the bath and it may happen that, for this reason, the electrical connection between the contact points and the conductive layer on which the studs are formed is broken.

The other reason is that it happens often that the metal e.g. gold which forms these connection studs, is likewise deposited around the contact points to form an over thickness which in the case where one thereafter proceeds to a thinning down of the substrates following formation of the connection studs sometimes causes breaking of the latter.

Figure 2:
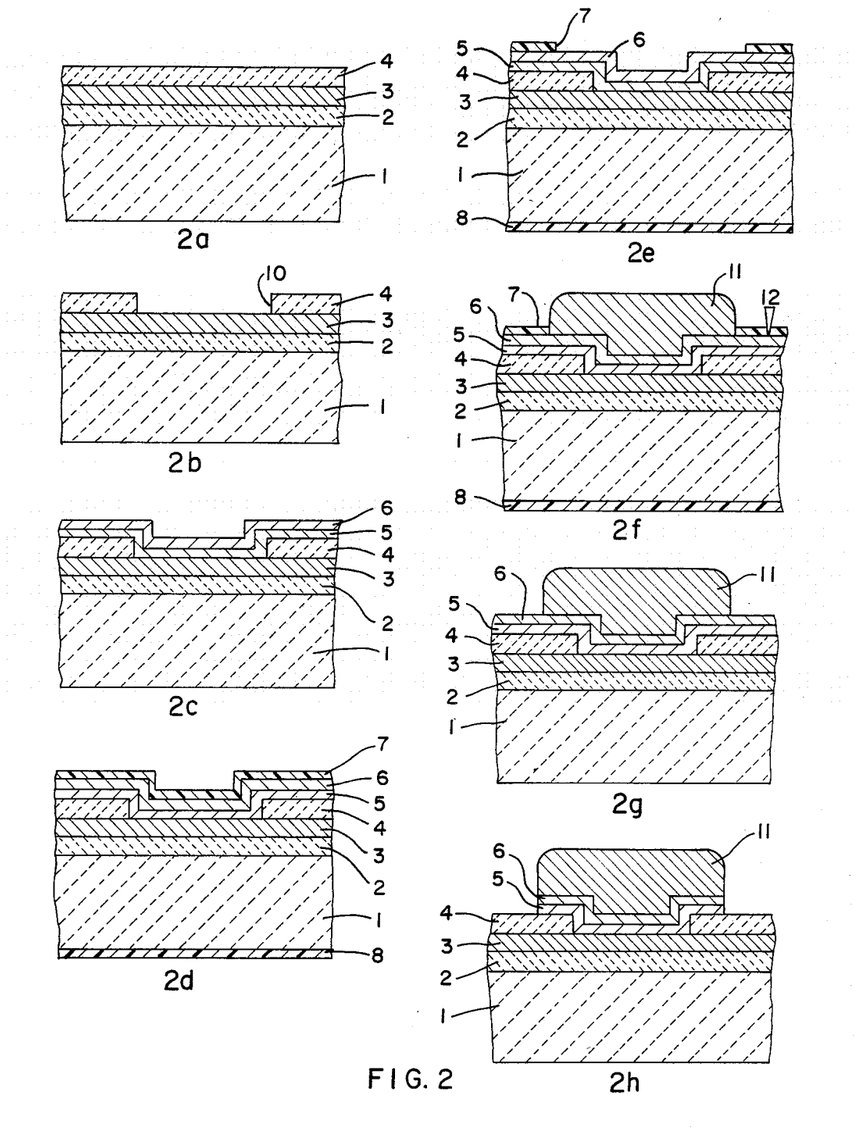
FIGS. 2a to 2h are cross-sections of an integrated circuit substrate illustrating the example of the process of formation of connection studs as described hereinbefore.

Thanks to its conception the arrangement according to the invention enables likewise to overcome these difficulties exhibited by existing apparatus but on condition that the conductive layer on which the connection studs are formed or an electrical contact layer in contact with the latter likewise exists whether or not by design on at least a portion of the edge of the substrates, which may be the case for the gold layer 6 of FIG. 2 and for the longer rectilinear portion a of the substrates when one proceeds in a certain manner to the deposition of this layer by vacuum evaporation.

Figure 8A:
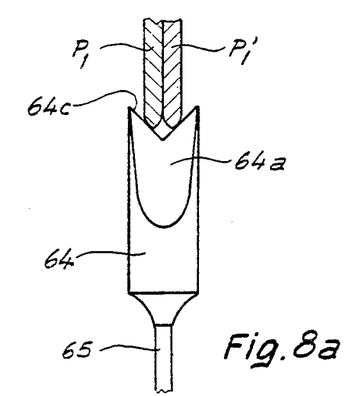
FIGS. 8a and 8b are respective views of the front surface and of the side of another form of execution of the contact points.
Figure 8B:
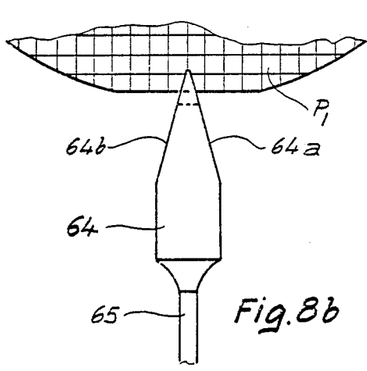

Concerning the form of execution shown on FIGS. 3 to 6, it is sufficient to avoid every possibility of contact rupture and the formation of over thicknesses on the front surface of the substrates, to replace each of the pairs of contact points 61 to 63 by a single point 64 the form of which is shown on FIGS. 8a and 8b.

This point 64 is in the form of a small cylinder of a diameter greater than twice the thickness of the integrated circuit substrates fastened to the end of a wire and which exhibits a forked extremity formed by two opposed bevels 64a, 64b and by a cut-out in V form 64c in the edge defined by the two bevels, the opening angle of this cutout being equal to that of the grooves 28 and 52 of the bars 25a and 25b of the central runner 25 of the framework 20 (see FIG. 3).

Naturally point 64 might also take another form, for instance that of a cylinder with a V shape groove on one of its edges but one would not obtain as good an electrical contact with the conductive layer on the edges of the substrates.

The four points 64 may be fastened on the same side of the metallic bar 58 and at the same places as points 60 to 63 but there must then be provided in bars 25a and 25b of the runner 25 notches such as 66, 67, 68 and 69 as shown on FIG. 3 in order that the V cut-outs of points 64 may be found exactly in the prolongation of the grooves of bars 25a and 25b when the substrates are in place. Moreover, mounting these points 64 must be effected such that their contact with the conductive layer of the substrates is assured thanks to the elasticity of the wires at the ends of which they are fixed.

It is to be noted that the use of points such as 64 further facilitates the placing of the substrates onto the arrangement. It is well understood that it must be seen to at the moment of placement that it is indeed a portion of the edges of the substrates covered by the conductive layer which is introduced into the slot of the central runner.

Figure 9:
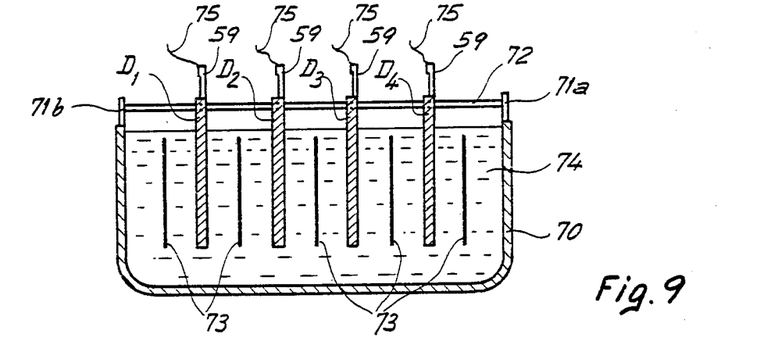
FIG. 9 shows schematically how under the preferred form of execution shown as example several arrangements may be placed in an electrolytic vat.

FIG. 9 shows very schematically how several arrangements in accordance with the invention as hereinbefore described may be placed into an electrolytic vat.

The vat 70 bears at each of its extremities a support 71a, respectively 71b, in the form of a fork. Arrangements $D_1$, $D_2$, $D_3$, $D_4$ are placed approximately parallel among themselves and spaced at substantially equal distances from one another onto a rigid bar 72 which is seated in the notches 27 of the suspension runners 23 and which rests on the supports 71a and 71b.

When they are plunged into the galvanic bath 74 approximately up to the level of their upper runner 24, arrangements $D_1$ to $D_4$ are each between two anodes 73 approximately parallel to the latter, a single anode being provided between two arrangements. These anodes which may be in the form of plates or grids are coupled to the positive terminal of the current source of the vat by means not shown. FIG. 9 shows likewise the wires 75 which are coupled to the ends of the conductive stems 59 (see FIG. 3) of the arrangements $D_1$ to $D_4$ in order to connect the latter to the negative terminal of the source.

Naturally the invention is not limited to the form which has been described.

As has already been indicated, the arrangement may be conceived in order to treat more than four pairs of substrates simultaneously. It might also be arranged to treat fewer, for instance two only.

The electric system and/or the positioning system may likewise be realized in a different manner.

Moreover, the arrangement may well be designed to be placed other than vertically. It is clear that it may be adapted to different types of vats.

Finally, it must be emphasized that the arrangement is not limited to integrated circuits formed on a semi-conductive substrate. It applies likewise to other integration technologies, but not in all cases with the same advantages.

What we claim is:

1. An arrangement for the electrolytic deposition of a conductive material on integrated circuit substrates each having a front face bearing an electrically conductive layer on which said material is to be deposited at least locally, a back and a substantially circular periphery, said arrangement being designed to be put into an electrolytic vat including anodes and fed by a direct current source located outside said vat, said arrangement comprising:
   a frame work arranged to receive at least a first pair of integrated circuit substrates and including in the same plane two riser members and at least a first and a second runner member essentially parallel to one another and fastened at their ends to the riser members so as to be separated by a distance greater than the diameter of said substrates, said riser and runner members defining a space for receiving said substrates;
   a mechanical system fixed to the framework for positioning and maintaining said substrates back-to-back and in contact against one another in said plane of the framework, said mechanical system including a longitudinal groove formed in the second runner member and arranged to receive a first portion of the periphery of each substrate, and a mechanism positioned in said space on the side of the first runner member and including a groove substantially facing the groove of the second runner member and arranged to receive a second portion of each substrate diametrically opposed to said first portion, said mechanism including means for applying a force directed towards said second runner member to said second portions of the substrates; and,
   an electrical system likewise fixed to the framework to enable coupling said electrically conductive layer of each substrate to said source.

2. An arrangement as set forth in claim 1 wherein said mechanism comprises at least one lever articulated at one end thereof on one of the framework riser members so as to be pivotable in the plane thereof and a spring fixed to the first runner member so as to urge said lever toward the second runner member.

3. An arrangement as set forth in claim 2 wherein said mechanism comprises two levers arranged side by side in the direction perpendicular to the plane of the framework and which are each articulated at one end thereof on one of the framework riser members so as to be pivotable in the plane thereof and about a common axis, each lever being associated with one of said substrates as well as two springs fixed to the first runner member so as to urge the two levers independently toward the second runner member and wherein the groove associated with said mechanism is formed between the two levers.

4. An arrangement as set forth in claim 3 wherein the space defined by the framework riser and runner members is designed to receive a second pair of substrates placed beside the first pair thereof and wherein said mechanism comprises two further levers and two further springs arranged and adapted so that the mechanism is symmetric about a central plane perpendicular to the runner members.

5. An arrangement as set forth in claim 4 wherein said mechanism further comprises an attachment member mechanically coupled to the first runner member and on which are articulated the ends of the levers opposite to those attached to the framework riser members in a manner such that on one hand said attachment member may be displaced between a first position in which the levers are substantially parallel to the first runner member and a second position in which the attachment member is in contact with said first runner member, such displacement effecting pivoting of the levers, and on the other hand the two levers located side by side may be subjected to a small shearing movement relative to one another at least when the attachment member is in its first position so as to compensate for differences in the diameters of said back-to-back substrates.

6. An arrangement as set forth in claim 4 wherein the system for positioning and maintaining said substrates in place further comprises two lateral abutments for said substrates said abutments each being fixed to one of the framework riser members substantially midway between the levers and the second runner member.

7. The arrangement of claim 3 in which each of said levers has an elongated proturberance with its center located at a distance from the framework riser on which the lever is articulated greater than the radius of said substrates, and in which each of said protuberances has a chamfered edge forming a side of the groove of said mechanism.

8. An arrangement as set forth in claim 1 wherein the grooves of said mechanism and of said second runner member are in the form of a V the interior angle of which is such that the force exerted by the mechanism on the periphery of the substrates is sufficient to maintain said substrates in contact.

9. An arrangement as set forth in claim 1 wherein the framework includes a third runner member parallel to said first and second runner members arranged relative to the riser members and said second runner member so as to define an additional space intended to receive additional substrates and a further system for positioning and maintaining said substrates in place in said additional space, the two systems being symmetrically located about a central plane from the second runner member perpendicular to the framework riser members.

10. An arrangement as set forth in claim 1 wherein the framework includes an additional runner member for the suspending thereof in said electrolytic vat.

11. An arrangement as set forth in claim 1 wherein the electrical system comprises at least one contact point per substrate arranged so as to be brought to bear at one point on the conductive layer borne by the front face of said substrate proximate the periphery thereof.

12. An arrangement as set forth in claim 11 or in claim 13 wherein the contact points are fixed to a common electrically conductive member attached to said framework.

13. An arrangement as set forth in claim 1 intended for printed circuit substrates on which the conductive layer likewise covers at least a portion of the periphery thereof wherein the electrical system comprises at least one contact point per pair of back-to-back substrates, each contact point exhibiting a notch at its end and being placed on the framework in a manner such that the portions of the peripheries of the substrates covered by the conductive layer penetrate said notch and are maintained in contact with said point.

14. The arrangement of claim 13 in which said contact point comprises a small cylinder of a diameter greater than twice the thickness of said pair of back-to-back substrates, and said cylinder has a forked extremity formed by two opposing bevels and a V-shaped cut-out in an edge defined by said two bevels, the opening angle of said V-shaped cut-out being substantially equal to that of the groove of said second runner member.

15. The arrangement of claim 1 in which said framework is made of an electrically insulating material.

16. The arrangement of claim 1 in which said grooves are adapted to receive substantially rectilinear first and second portions of each substrate, and in which the groove of said mechanism is approximately equal to the length of at least one of said rectilinear first and second portions.

17. The arrangement of claim 1 in which said grooves have a V-form and are positioned for receiving said back-to-back substrates such that the force provided by said mechanism causes the sides of said grooves to provide on the peripheries of said substrates opposing forces which press together the backs of said substrates.

18. The arrangement of claim 17 in which said substrates are made of a semi-conductive material and said opposing forces are sufficient to maintain the backs of said substrates in contact with one another so as to prevent a deposit of said conductive material on the surfaces of said substrate backs.

19. The arrangement of claim 1 in which said electrical system includes means for coupling said electrically conductive layer of each substrate to the negative terminal of said direct current source.

20. The arrangement of claim 1 in which at least a portion of said electrical system is immersible in an electrolytic bath in said vat and said immersible portion is covered by a protective layer of electrically insulating material.

* * * * *